United States Patent [19]

Krüger

[11] Patent Number: 4,814,697

[45] Date of Patent: Mar. 21, 1989

[54] TESTING ADAPTER

[75] Inventor: Gustav Krüger, Herrenberg, Fed. Rep. of Germany

[73] Assignee: Feinmetall GmbH, Herrenberg, Fed. Rep. of Germany

[21] Appl. No.: 27,791

[22] Filed: Mar. 19, 1987

[30] Foreign Application Priority Data

Mar. 26, 1986 [DE] Fed. Rep. of Germany ....... 3610153

[51] Int. Cl.$^4$ .......................... G01R 31/02; G01R 1/06
[52] U.S. Cl. ............................ 324/158 P; 324/73 PC; 324/158 F
[58] Field of Search ............... 324/158 P, 158 F, 72.5, 324/73 PC

[56] References Cited

U.S. PATENT DOCUMENTS 4,551,673 11/1985 Barth et al. ..................... 324/158 F

FOREIGN PATENT DOCUMENTS 2169153 7/1986 United Kingdom ............ 324/158 F

Primary Examiner—Ernest F. Karlsen
Attorney, Agent, or Firm—Herbert Dubno

[57] ABSTRACT

A testing adapter for the contacting of conductor plates for the purpose of their testing includes a plurality of metallic resilient contact pins. Each of these pins includes a cylinder in which a piston of a piston member is received for axial sliding. The piston member extends beyond a cylinder jacket of the cylinder and passes through a bore of a rear guiding plate of the testing adapter. A helical compression spring is arranged on that region of the piston member which extends beyond the cylinder jacket. The piston member is shorter than one-half of the overall length of the resilient contact pin in its relaxes state, and the helical compression spring is at least partially accommodated within the respective bore of the rear guiding plate.

8 Claims, 1 Drawing Sheet

TESTING ADAPTER

FIELD OF THE INVENTION

The present invention relates to testing equipment in generally and, more particularly to a testing adapter for the contacting of conductor plates.

BACKGROUND OF THE INVENTION

There are already known various constructions of testing adapters of the type here under consideration. In one of such known adapter constructions, the testing adapter includes a plurality of metallic resilient contact pins, each of which includes a thin tubular cylinder jacket having a length which is a multiple of its maximum outer diameter. This cylinder jacket, together with a contact member that is fixedly inserted thereinto, forms a cylinder component. In this construction, a piston of a piston component that is coaxial to the cylinder component is supported for axial sliding in the cylinder component. The contact member includes a contact head situated outwardly of the cylinder jacket and serving for contacting the conductor plates. The piston of the piston component projects rearwardly beyond the cylinder jacket and extends through a bore of a rear guiding plate to contact a connecting contact of a contact carrier for establishing electrical connection of the resilient contact pin with such contact. Furthermore, a helical compression spring is arranged on the region of the piston component which projects over the cylinder jacket. The spring is braced against a rear end face of the cylinder jacket and against a shoulder of the piston component. This known testing adapter further includes a front guiding plate which has a through bore for each resilient contact pin. A front region of the cylinder jacket is guided with a sliding bearing play in the respective through bore of the front guiding plate.

As advantageous as this adapter construction may be in many respects, experience has shown that it suffers from certain drawbacks, such as a relatively high cost of manufacture thereof, unnecessarily large dimensions of certain components or elements of the contact pins used therein, and resulting relatively high weight of this testing adapter.

OBJECTS OF THE INVENTION

Accordingly, it is a general object of the present invention to avoid the disadvantages of the prior art.

More particularly, it is an object of the present invention to provide a testing adapter which does not possess the drawbacks of the known arrangements of this type.

Still another object of the present invention is to provide a testing adapter of the type here under consideration which can be manufactured at a significantly reduced cost than the previously known testing adapter constructions.

It is yet another object of the present invention to design the above testing adapter in such a manner as to keep the dimensions of the various components and elements thereof, as well as the weight of the adapter, to a minimum.

A concomitant object of the present invention is so to construct the testing adapter of the above type as to be relatively simple in construction, inexpensive to manufacture, easy to use, and yet reliable in operation.

SUMMARY OF THE INVENTION

In keeping with these objects and others which will become apparent hereafter, one object of the present invention resides in a testing adapter for the contacting of conductor plates for testing the same. This testing adapter comprises a front guiding plate arranged closer to and a rear guiding plate arranged farther away from the respective conductor plate to be tested during the performance of a testing operation and each including a plurality of through bores; a contact carrier rearwardly of the rear guiding plate and having a plurality of connecting contacts; and a plurality of resilient metallic contact pins passing with a slight sliding bearing play through the bores of the front and rear guiding plates. Each of the resilient contact pins includes a cylinder having a thin tubular cylinder jacket of a length which is a multiple of its maximum outer diameter and having a rear end face, and a contact member that is fixedly inserted into the cylinder jacket and includes a contact head arranged outwardly of the cylinder jacket and serving for contacting the respective conductor plates. The resilient contact pin further includes a piston member which is shorter than one-half of the total length of the resilient contact pin in its unloaded state, having an annular shoulder and including a piston supported in the cylinder coaxially thereto for axial sliding therein and projecting rearwardly beyond the cylinder jacket and through the respective bore of the rear guiding plate into contact with the respective connecting contact of the contact plate for establishing an electrical connection of the resilient contact pin with the connecting contact. Moreover, the resilient contact pin includes a helical compression spring arranged on a region of the piston member which projects beyond the cylinder jacket and bracing itself against the rear end face of the cylinder jacket and against the annular shoulder of the piston member and at least partially accommodated in the respective bore of the rear guiding plate.

By resorting to the present invention, it is possible to achieve, while the total length of the resilient contact pin in its unloaded or relaxed state is being maintained constant, advantageously at about 65 millimeters, for instance, a considerable shortening of the piston member and, as a result of this, a substantial reduction in the manufacturing costs thereof, inasmuch as the helical compression spring is no longer fully confined between the rear guiding plate of the testing adapter and the cylinder jacket of the respective resilient contact pin; rather, this spring is at least partially accommodated in the bore of the rear guiding plate. As a result of this, the manufacturing costs of the resilient contact pin are reduced. Also, the cylinder jacket which can be produced at a low cost and which may consist of brass or of other easily processable metals, can be made longer and, as a result, the projection of the piston member beyond this cylinder jacket can be made smaller. This means that the piston member need penetrate into the cylinder jacket for its sufficient axial guidance to a lesser extent than in the conventional resilient contact pin which will be described in more detail later.

As a result of the lower tilting moments acting on the piston member, the wear can be reduced and the durability or life span of the resilient contact pin can be improved. Moreover, the weight of the resilient contact pin and thus the loading of the testing adapter by the resilient contact pin can be dminished, which brings about further advantages. Also, the dimensions of the resilient contact pin accoridng to the invention can be such that it can be substituted for the resilient contact pin of the conventional construction, so that the dimensions of the remaining components of the known testing adapter can remain unchanged.

By using the present invention, it is possible, without encountering any difficulties, to achieve with unchanged overall length of the resilient contact pin in its relaxed state that the piston member is even much shorter than the one-half of the total length of the relaxed resilient contact pin. Advantageously, it may be provided that the ratio of the length of the resilient contact pin in the unloaded state thereof to the length of the piston member exceeds 2:1, and preferably exceeds 2.5:1. It is particularly advantageous when this ratio amounts substantially to between 3:1 and 4:1. As a result of this, the manufacturing expenses and the wear of the piston member and of the resilient contact pin can be especially strongly reduced and the guidance of the piston member in the cylinder is facilitated and improved.

According to another advantageous aspect of the present invention, the helical compression spring is arranged on a predetermined region of the piston member which has the same diameter as that region of the piston member which is received in the cylinder. This predetermined region of the piston member is advantageously spaced from an adjoining end of the piston member by a distance of 5 millimeters at the most. The piston member advantageously substantially consists of hardened steel.

The present invention is also directed to a resilient contact pin for use in a testing adapter of the type including a front guiding plate arranged closer to and a rear guiding plate arranged farther away from the respective conductor plate to be tested during the performance of a testing operation and each including a plurality of through bores, and a contact carrier situated rearwardly of the rear guiding plate and having a plurality of connecting contacts, for the contacting of conductor plates for testing the same. The resilient pin of the present invention comprises a cylinder including a thin tubular cylinder jacket of a length which is a multiple of its maximum outer diameter and having a rear end face, and a contact member that is fixedly inserted into the cylinder jacket and includes a contact head arranged outwardly of the cylinder jacket and serving for contacting the respective conductor plates. The pin further comprises a piston member shorter than one-half of the total length of the resilient contact pin in its unloaded state, having an annular shoulder and including a piston supported in the cylinder coaxially thereto for axial sliding therein and projecting rearwardly beyond the cylinder jacket and through the respective bore of the rear guiding plate into contact with the respective connecting contact of the contact plate for establishing an electrical connection of the resilient contact pin with the connecting contact. Finally, the pin comprises a helical compression spring arranged on a region of the piston member which projects beyond the cylinder jacket and bracing itself against the rear end face of the cylinder jacket and against the annular shoulder of the piston member and at least partially accommodated in the respective bore of the rear guiding plate.

BRIEF DESCRIPTION OF THE DRAWING

The present invention will be described below in more detail with reference to the accompanying drawing in which.

DETAILED DESCRIPTION

Figure 1:
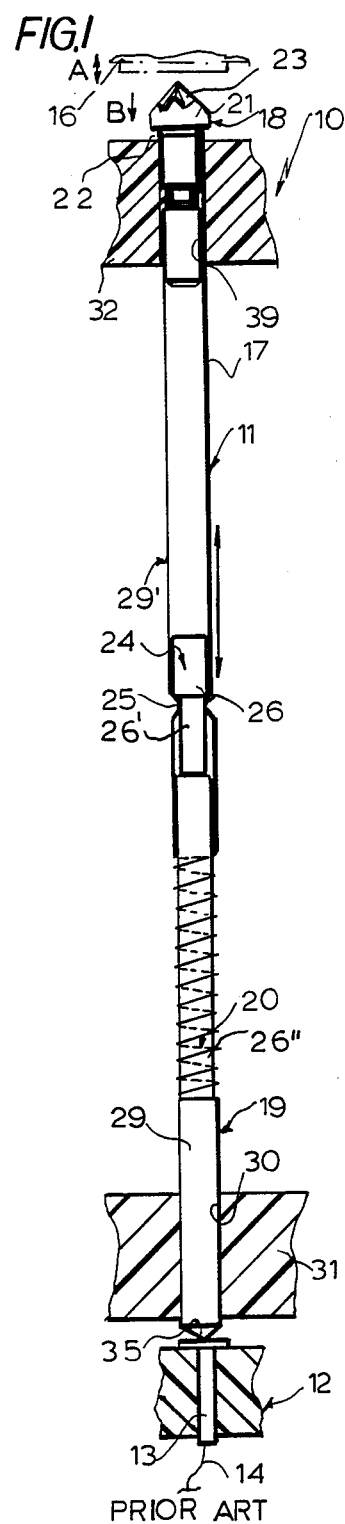
FIG. 1 is a partially sectioned side elevational view of a part of a conventional testing adapter including a single resilient contact pin and the parts cooperating therewith during the testing operation of the testing adapter.

Referring now to the drawing in detail, and first to FIG. 1 thereof, it may be seen that the reference numeral 10 has been used therein to identify a testing adapter of the type here under consideration, which is of a conventional construction and which is presented here for comparison purposes. The testing adapter 10 includes a plurality of straight resilient contact pins 11 which are identical with one another and are arranged parallel to each other. The adapter 10 may include, for example, a multitude, and in many instances even many thousands, of such resilient contact pins 11, of which only one is being presented here. The testing adapter 10 includes a plate-shaped, rigid, stationary connecting contact carrier 12, on which there are arranged metallic connecting contacts which are electrically insulated from each other and of which one is shown and identified by the reference numeral 13. One electrical conductor 14 is connected to each of the connecting contacts 13 and leads away from the testing adapter 10 and to a non-illustrated evaluating device or evaluator which conducts the electric testing of conductor plates 16 in cooperation with the aforementioned testing adapter 10. In order to achieve contacting of the respective conductor plate 16, which is shown fragmentarily in dash-dotted lines, by the resilient contact pins, such as 11, of this testing adapter 10, it is possible to accomplish a vertical relative movement between the conductor plate 16 and the testing adapter 10 in the directions indicated by a double-headed arrow A.

This known resilient contact pin 11 has a total length of about 65 millimeters in its unloaded or relaxed state. The resilient contact pin 11 consists of a thin tubular cylinder jacket 17, a massive contact member 18, a piston member 19 and a helical compression spring 20. The outer diameter of the cylinder jacket 17 is about 1.18 millimeter. The contact member 18 is fixedly inserted into the front end region of the cylinder jacket 17 and extends beyond the cylinder jacket 17 by about 2 mm. The contact member 18 has a contact head 21 which forms an annular shoulder 22 at the lower side of the contact member 18. The contact head 21 further includes a tip 23 which is intended for coming into contact with the respective conductor plate 16. The piston member 19, which is rotationally symmetrical, is coaxially inserted into the cylinder jacket 17, which is also rotationally symmetrical and has a substantially circular cross section, from the lower end of the cylinder jacket 17. This massive piston member 19 includes a piston 24 which is received in the cylinder jacket 17 for axial sliding. The piston member 19 has an annular shoulder formed by a construction 26'. In the relaxed state of the resilient contact pin 11, this annular shoulder abuts, as a result of prestressing of the helical compression spring 20, an annular inwardly extending lip 25 of the cylinder jacket 17, which is situated almost exactly at one-half of the height of the relaxed resilient contact pin 11. The length of the piston member 19, which consists of nickel-plated and hardened steel, amounts to 36 millimeters and is thus 1.1 times longer than the half of the total length of the relaxed resilient contact pin 11. The cylinder jacket 17 and the contact member 18 which is fixedly held therein together form a cylinder 29' which is closed at its upper end and in which the piston 24, and more particularly its two regions 26 and 26'', can slide. Of these two regions 26 and 26'', the region 26'' permanently projects out of the cylinder 29'. As mentioned above, the piston 24 has the constriction 26' which determines its axial movability. The helical compression spring 20 is arranged on the region 26'' of the piston 24 outwardly of the cylinder jacket 17. The spring 20 braces itself, on the one hand, against the rear end face of the cylinder jacket 17 and, on the other hand, against the piston member 19 at an annular shoulder 28. A cylindrical guiding section 29 of the piston member 19, which is 14.5 millimeters long and has an enlarged diameter, commences at the shoulder 28 and extends all the way to a point 35 of the piston member 19, which is 0.5 millimeter long and contacts the associated connecting contact 13 of the carrier 12. In the relaxed state of the resilient contact pin 11, the spring 20 is 8 millimeters long in the illustrated prestressed condition thereof. The length of the cylinder jacket 17 amounts to 40 millimeters.

The cylindrical guiding section 29 is guided for axial sliding with a small sliding bearing play in a cylindrical bore 30 of a rear guiding plate 31 of the testing adapter 10. The cylinder jacket 17 is guided for axial sliding with a small sliding bearing play in a bore 39 of a front guiding plate 32 of the testing adapter 10. This front guiding plate 32 is axially movable in the directions of the double-headed arrow A, that is, in the directions of the longitudinal axis of the resilient contact pin 11, and is loaded by non-illustrated return spring means. For the testing of the respective conductor plate 16, this plate 16 is pressed in a predetermined position against the contact tips 23 of the resilient contact pins 11, and then is displaced by a certain distance in the direction indicated by an arrow B, as a result of which the contact members 18 are moved, together with the cylinder jackets 17 which are fixedly connected therewith, in the direction of the arrow B. Consequently, owing to the contact of the rear annular shoulders 22 of the contact heads 21 with the front guiding plate 32, even this front guiding plate 32 is moved jointly with these contact members 18 and with the cylinder jackets 17 in the direction of the arrow B and the helical compression springs 20 are more strongly stressed due to resilient compression thereof by a spring distance of, for example, 4 millimeters, so that they press the contact tips 23 with predetermined forces against the conductor plate 16 and the evaluation device can now perform the electric testing of the conductor plate 16 for freedom from faults. Subsequently thereto, the conductor plate 16 is again removed from the testing adapter 10 and the contact members 18 with the cylinder jackets 17, as well as the front guiding plate 32, then return to their rest positions due to the action of the return springs. The spring 20 is permanently situated outwardly of the guiding plate 31, so that the guiding section 29 permanently passes through the full length of the bore 30. There is encountered a large projection of the piston member 19 beyond the cylinder jacket 17, amounting to 23 millimeters in the relaxed state of the resilient contact pin 11 and, therefore, even the region of the piston 24 which is accommodated in the cylinder jacket 17 must be relatively long, namely 13 millimeters, to obtain good guidance. Taken together, the piston member 19 of the contact pin 11 of this construction has a relatively large length of 36 millimeters, and this considerably increases the expense incurred in manufacturing the same, so that the expenditure for the piston member 19 constitutes a relatively large proportion of the total cost of the resilient contact pin 11 of this construction.

Figure 2:
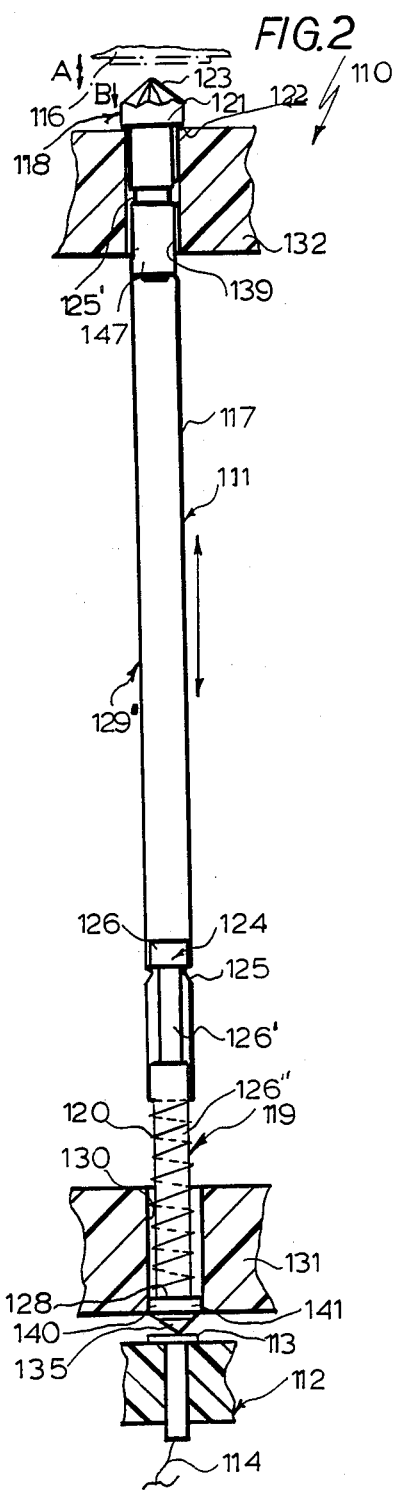
FIG. 2 is a view similar to FIG. 1 but showing a resilient contact pin constructed in accordance with the present invention.

Turning now to FIG. 2 of the drawing, which shows a testing adapter construction according to the present invention, it can be seen that reference numerals in this FIGURE are increased by 100 relative to those used in connection with FIG. 1 to designate corresponding elements. The testing adapter 110 of this construction again includes a large number of resilient contact pins 111 constructed in accordance with the present invention, of which only one has been illustrated in the drawing.

The resilient contact pin 111 includes a cylinder 129', a piston member 119 which is axially slidably received in the cylinder 129', and a cylindrical helic compression spring 120. The cylinder 129' consists of a tubular cylinder jacket 117, in which there is fixedly inserted a contact member 118, which may correspond to the contact member 18 of FIG. 1, and includes a contact head 121 having a contact pin 123 for the contacting of conductor plates, such as 116.

The testing adapter 110 includes, besides the illustrated resilient contact pin 111, a large or even a very large number, preferably thousands or many thousands, of identical resilient contact pins 111. Here again, rear contact tips 135 of piston members 119 of all of these resilient contact pins 111 contact associated connecting contacts 113 of the carrier 112. This carrier 112 with the connecting contacts 113 may correspond, without any changes, to the carrier 12 with the connecting contacts 13 in accordance with FIG. 1. Even a front guiding plate 132 and its movable mounting (indicated by the double-headed arrow A) and resilient support may correspond, without any changes, to the front guiding plate 32 of FIG. 1 and its movable mounting and resilient support. The same is also valid for the diameters of respective bores 139 in the front guiding plate 132 for the resilient contact pins 111. A rear guiding plate 131 may correspond as to its configuration and the diameters of its bores 130 to the rear guiding plate 31 of FIG. 1. In this particular construction of the testing adapter 110, the rear guiding plate 131 is fixedly arranged on the testing adapter 110 at a small distance of preferably about 0.5 to 1.5 millimeter from the connecting contacts 113.

The straight resilient contact pin 111 may have, in its relaxed state, the same total length of about 65 millimeters as the resilient contact pin 11 according to FIG. 1. Similary, the outer diameter of its cylinder jacket 117 may also amount to about 1.18 millimeter. However, if so desired, even other dimensions of this resilient contact pin 111 are possible. The front-end region of the cylinder jacket 117 of the resilient pin 111 is axially guided in the bore 139 of the front guiding plate 132 with a small sliding bearing play.

In this resilient contact pin 111 in accordance with FIG. 2 of the drawing, the rotationally symmetrical cylinder jacket 117 has a circular cross section, except for the presence of two flanged portions 125 and 125'. This cylinder jacket 117 is longer with respect to the overall length of the resilient contact pin 111 than is the cylinder jacket 17 of the resilient contact pin 11 according to FIG. 1 and may advantageously be 51 millimeters long, inasmuch as the cylindrical helical compression spring 120, which may have in its illustrated prestressed condition a length of preferably at least 7 millimeters, preferably of about 10 millimeters, extends, as shown, over a considerable proportion of its length into the bore 130 in the relaxed state of the resilient contact pin 111 and nearly penetrates through this bore 130. The relatively smaller projection of the piston member 119 beyond the cylinder jacket 117, which is achieved in this manner, already considerably reduces the length of the piston member 119 and renders it additionally possible that the piston member 119 need extend into the cylinder jacket 117 to a lesser extent than is the case in the resilient contact pin 11 according to FIG. 1. This projection of the piston member 119 beyond the cylinder jacket 117 may amount in the relaxed resilient contact pin 111 preferably to approximately 9 to 13 millimeters, particularly advantageously to approximately 11 millimeters. The total length of the relaxed resilient contact pin 111 here amounts to about a 3.5 times multiple of the length of the piston member 119, so that the manufacture of this piston member 119 is considerably more economical than that of the piston member 19 according to FIG. 1. The length of the piston member 119 may advantageously amount, for example, to 18 millimeters with the total length of the relaxed resilient contact pin amounting to about 65 millimeters.

The massive piston member 119, which may be advantageously constructed in such a manner as to be of one piece and may preferably consist of hardened and nickel-plated steel, consists of the piston 124 whose regions 126 and 126" that have the same diameter are axially guided with a small sliding bearing play in the cylinder jacket 117, and a short end section 140 which adjoins the piston 124. The end section 140, which is only 0.8 to 5 millimeters long, and as shown about 1 millimeter long, has a short, for instance about 0.5 millimeter long, cylindrical region 141 which is adjoined by the conical tip 135 that contacts the connecting contact 113. This cylindrical region 140 partially extends with a small sliding bearing play into the bore 130, so that the resilient contact pin 111 is guided with a small axial sliding bearing play both in the front guiding plate 132 and in the rear guiding plate 131. However, the region 140 of the piston member 119 penetrates into the bore 130 only to a small extent, for example to the extent of only approximately 0.3 to 1.5 millimeters. This region 140 changes over into the region 126" of the piston 124 by an annular shoulder 128 against which the spring 120 abuts with a certain amount of prestressing. The spring 120, which is situated outwardly of the cylinder 129', braces itself at its upper end against the lower end face of the cylinder jacket 117. This cylinder jacket 117 and the contact member 118 together form the upwardly closed cylinder 129' in which the piston 124 is received for axial sliding.

The piston 124 is provided with a constiction 126' causing, in cooperation with the lip 125, the axial movability of the piston 124, being permanently situated within the cylinder 129', and subdividing the piston 124 into the end region 126 which is advantageously only about 1 to 2 millimeters long and the region 126" which is longer.

The outer diameter of the spring 120 when the latter is completely compressed is slightly smaller than the diameter of the bore 130 of the rear guiding plate 131. The helical compression spring 120 is constantly prestressed. The length of the spring 120 in the relaxed state of the resilient contact pin 111 may preferably amount to approximately 7 to 10 millimeters. The lip 125' of the cylinder jacket 117 holds the contact member 118 and the lip 125 constitutes an abutment for the piston region 126 in the relaxed state of the resilient contact pin 111.

The massive contact member 118 of the resilient contact pin 111 according to FIG. 2 may be constructed and/or configured and be arranged and held in the cylinder jacket 117 correspondingly to the contact member 18 of the resilient contact pin 11 according to FIG. 1. The contact tip 123 may have any desired configuration, for instance that which is illustrated and which includes a plurality of sharp edges which meet at the front end of this contact tip 123.

The resilient contact pin 111 according to FIG. 2 of the drawing, because of the significantly more economical construction of the piston member 119 thereof, is significantly more advantageous as far as its cost is concerned than the resilient contact pin 11 according to FIG. 1. Inasmuch as the testing adapters 110 generally include very large numbers of such resilient contact pins 111, generally several thousand or many thousand of such resilient contact pins 111, for example about 20,000 of the resilient contact pins 111, the savings are commensurately large. Also, the weight of the resilient contact pin 111 and thus the weight of the testing adapter 110 are advantageously reduced by the shorter piston member 119.

The piston member 119, as well as the contact member 118 may be one-piece components. The contact member 118, as well as the piston member 119, may consist of hardened, nickel-plated steel. The cylinder jacket 117 may consist of brass or of another suitable metal which has a good electrical conductivity.

Each of the piston member 119, the cylinder jacket 117, and a stem 147 of the contact member 118 which is accommodated in the cylinder jacket 117, is rotationally symmetrical and they are coaxial with respect to one another. Even the contact head 121 has a rotationally symmetrical section which is adjoined by the inclined surfaces which form the tip 123. This contact tip 123 serves for the contacting of the conductor plates 116. The contact head 121 forms at its rear side an annular shoulder 122 which abuts the cylinder jacket 117 and projects beyond the latter at all sides. The annular shoulder 122 serves for the entrainment of the front guiding plate 132 for movement in the direction of the arrow B during the contacting of the conductor plates 116. This annular shoulder 122 may constantly contact the front guiding plate 132, or it may be situated, as illustrated, at a small distance upwardly of the front guiding plate 132 in the relaxed state of the resilient contact pin 111.

During the testing of the conductor plate 116, the latter is moved toward the testing adapter 110 in the direction of the arrow B, and/or the testing adapter 110 is moved oppositely to the arrow B toward the conductor plate 116. The conductor plate 116 then compresses the resilient contact pins 111 to the extent of a predetermined resilient displacement stroke, for instance of 4 millimeters, in that it moves the contact tips 123 of the resilient contact pins 111, and thus their contact members 118 with the cylinder jackets 117, oppositely to the action of the respective cylindrical helical compression springs 120 in the direction toward the connecting contact carrier 112. During this movement, the annular shoulders 122 of the contact members 118 also come into contact with the upper surface of the front guiding plate 132, in the event that they have not already contacted the same in the rest condition. As a result of this, the contact heads 121 of the contact members 119 entrain the front guiding plate 132 for joint movement therewith in the direction of the arrow B. Herein, the resilient displacement stroke by which the individual springs 120 are compressed during this operation is provided in such a manner that, at the end of the resilient displacement stroke, the contact tip 123 is pressed against the conductor plate 116 with a predetermined force, for instance, with a force of 100 to 300 cN. At this time, the evaluator, that is the evaluation device, to which the testing adapter 110 is electrically connected can conduct the electric testing of the conductor plate 116 for the absence of faults, wherein the resilient contact pins 111 constitute parts of the electrical connections between the evaluating device and the respective conductor plate 116. This aforementioned resilient displacement stroke may be so large that, during the performance thereof, the rear end of the cylinder jacket 117 penetrates into the bore 130 of the rear guiding plate 131 or comes all the way to or close to this bore 130. After the accomplished testing, the conductor plate 116 is again removed from the testing adapter 110 and the resilient contact pins 111 and the front guiding plate 132 return into their rest positions. Thereafter, further conductor plates 116 can be tested in a corresponding manner. The bore 130 may preferably have a slightly larger diameter than the cylinder jacket 117, so that the latter may penetrate into the bore 130 if so desired or required.

It is also possible in many cases to immovably arrange the front guiding plate 132 on the testing adapter 110 in such a manner that the contact head 121 of the resilient contact pin 111 projects beyond the front guiding plate 132 at least to the extent necessary for the performance of the resilient displacement stroke of the resilient contact pin 111, so that the annular shoulder 122 does not come all the way into contact with the front guiding plate 132 during the testing of the conductor plates 116. The cylinder jacket 117 then conducts sliding movements of magnitudes corresponding to the aforementioned resilient displacement stroke in the associated bore 139 of the front guiding plate 132.

The electrical conductor which is connected to the connecting contact 113 and which leads to the evaluating device is identified by the reference numeral 114.

While the present invention has been described and illustrated herein as embodied in a specific construction of a testing adapter, it is not limited to the details of this particular construction, since various modifications and structural changes are possible and contemplated by the present invention. Thus, the scope of the present invention will be determined exclusively by the appended claims.

What is claimed is:

1. A testing adapter for the contacting of conductor plates for testing the same, comprising:
    a front guiding plate arranged closer to and a rear guiding plate plate arranged farther away from a conductor plate to be tested during the performance of a testing operation, said guiding plates including a plurality of mutually aligned through bores;
    a contact carrier situated rearwardly of said rear guiding plate and having a plurality of connecting contacts; and
    a plurality of elongated resilient metallic contact pins passing with a slight sliding bearing play through a respective mutually aligned pair of said bores of the front and rear guiding plates, each of said contact pins and each including
    a cylinder having
        a thin elongated tubular cylinder jacket, said jacket being centered on a respective axis and having a front end face and a rear end face, and
    a contact member is fixedly inserted into said cylinder jacket, said contact member being coaxial with said jacket and extending downwardly from said front face, said contact member including a contact head arranged outwardly of said cylinder and being coaxial with said jacket and serving for contacting the respective conductor plate to be tested;
    a piston member shorter than one-half of a total length of said resilient contact pin in its unloaded state, having an annular shoulder and including
        a piston in said cylinder coaxially to said jacket for axial sliding therein, said piston member projecting rearwardly beyond said cylinder jacket and through the respective bore of said rear guiding plate, said respective bore being coaxial with said jacket, so that said said piston member has contact with the respective one of said connecting contacts for establishing an electrical connection of said pin with said connecting contact during the testing operation, and
    a helical compression spring arranged on a region of said piston member which projects beyond said cylinder jacket and bracing itself against said annular shoulder of said piston member and at least partially accommodated in the respective bore of said rear guiding plate.

2. The testing adapter as defined in claim 1, wherein the ratio of the length of said resilient contact pin in said unloaded state thereof to the length of said piston member exceeds 2:1.

3. The testing adapter as defined in claim 2, wherein said ratio exceeds 2.5:1.

4. The testing adapter as defined in claim 3, wherein said ratio is substantially between 3:1 and 4:1.

5. The testing adapter as defined in claim 1, wherein said helical compression spring is arranged on a predetermined region of said piston member which has the same diameter as that region of said piston member which is received in said cylinder.

6. The testing adapter as defined in claim 5, wherein said predetermined region of said piston member is spaced from an adjoining end of said piston member by a distance of 5 millimeters at the most.

7. The testing adapter as defined in claim 1, wherein said piston member substantially consists of hardened steel.

8. A contact pin and plate assembly for the contacting of a conductor board for testing the same, said assembly comprising a plate formed with a bore, and a contact pin, said contact pin comprising:
    a cylinder having a thin elongated tubular cylinder jacket, said jacket being centered on an upright axis and having a front end face and a rear end faces, and a contact member being fixedly inserted into said cylinder jacket, said contact member being coaxial with said jacket and extending downwardly from said front face, said contact member including a contact head arranged outwardly of said cylinder and being coaxial with said jacket and serving for contacting the respective board to be tested;

a piston member being shorter than one-half of a total length of said resilient contact pin in its unloaded state, having an annular shoulder and including a piston in said cylinder coaxial with said jacket for axial sliding therein, said piston member projecting rearwardly beyond said cylinder jacket and through said bore of said plate, into contact with a respective connecting contact for establishing an electrical connection of said pin with said connecting contact; and a helical compression spring arranged on a region of said piston member which projects beyond said cylinder jacket and bracing itself against said annular shoulder of said piston member and at least partially accommodated in the respective bore of said plate.

* * * * *